United States Patent [19]
Young et al.

[11] Patent Number: 5,285,421
[45] Date of Patent: Feb. 8, 1994

[54] SCHEME FOR ELIMINATING PAGE BOUNDARY LIMITATION ON INITIAL ACCESS OF A SERIAL CONTIGUOUS ACCESS MEMORY

[75] Inventors: Elvan S. Young, Cupertino; Philip L. Craine, Saratoga, both of Calif.

[73] Assignee: Advanced Micro Devices, Sunnyvale, Calif.

[21] Appl. No.: 865,812

[22] Filed: Mar. 31, 1992

Related U.S. Application Data

[63] Continuation of Ser. No. 557,899, Jul. 25, 1990, abandoned.

[51] Int. Cl.⁵ .............................................. G11C 8/00
[52] U.S. Cl. ........................... 365/230.04; 365/230.03; 365/238.5; 365/189.02
[58] Field of Search ................ 365/189.02, 230.01, 365/230.03, 230.04, 230.05, 238, 238.5, 239, 240

[56] References Cited

U.S. PATENT DOCUMENTS

| | | | |
|---|---|---|---|
| 4,513,372 | 4/1985 | Ziegler et al. | 365/230.03 |
| 4,621,320 | 11/1986 | Holste et al. | 365/222 |
| 4,680,738 | 7/1987 | Tam | 365/239 |
| 4,715,017 | 12/1987 | Iwahashi | 365/239 |
| 4,805,094 | 2/1989 | Oye et al. | 395/250 |
| 4,811,297 | 3/1989 | Ogawa | 365/189.02 |
| 4,833,657 | 5/1989 | Tanaka | 365/230.04 |
| 4,849,937 | 7/1989 | Yoshimoto | 365/230.04 |
| 4,954,987 | 9/1990 | Auvinen et al. | 365/189.02 |
| 5,051,889 | 9/1991 | Fung et al. | 365/230.03 |

Primary Examiner—Joseph L. Dixon
Assistant Examiner—Jack A. Lane
Attorney, Agent, or Firm—Skjerven, Morrill MacPherson, Franklin & Friel

[57] ABSTRACT

In accordance with the present invention, a memory system capable of indefinite sequential access to a contiguous address space without stutter is provided. The memory system has a memory array divided into left and right halves, column and row decoders, memory output register banks A and B, and control logic. Upon initial access, the control logic determines whether, in the initial access data to be loaded in register banks A and B cross a row address boundary. If a row address boundary is crossed, data loaded into register bank A corresponds to data in one row in the right half of the memory array, and data in register bank B corresponds to data in the left half of the memory array in the next higher row. Thereafter, register banks A and B are interleaved for loading and output of memory data.

3 Claims, 7 Drawing Sheets

SCHEME FOR ELIMINATING PAGE BOUNDARY LIMITATION ON INITIAL ACCESS OF A SERIAL CONTIGUOUS ACCESS MEMORY

This application is a continuation of application Ser. No. 07/557,899, filed Jul. 25, 1990, now abandoned.

FIELD OF THE INVENTION

This application pertains to the field of high speed memory design; in particular, the present invention pertains to the design of high speed memory for sequential accesses to a contiguous address space.

BACKGROUND OF THE INVENTION

FIG. 1 shows a generalized organization of a memory system, comprising address input register 100, x-and Y-decoders 101 and 102 (also known as row and column decoders), a memory array 103, a sense amplifier circuit 104, a memory output register 105, and output buffers 106. In this organization, the address input register 100 receives a two-part address, which is decoded by the x- and y-decoders 101 and 102 to select the corresponding memory cell in memory array 103. The content of the selected memory cell is read by the sense amplifier circuit 104 and latched into the memory output register 105. Register 105 is typically a "see through" latch, such that a transition at the input of the latch is immediately reflected at the output of the latch. "Master-slave" latches are not used in this application because they require two clock edges to operate, therefore necessarily requiring a slower speed of operation. The output buffers 106, having greater current sourcing and sinking capabilities than the memory register 105, provide the output data at specified voltage levels to receiving devices external to the memory system.

In many applications, successive accesses to the memory system are often made to contiguous memory locations. This pattern of memory access, called "sequential access," may be exploited to implement a high performance memory system. One method of taking advantage of this access pattern is by latching into memory output register 105, in addition to the datum corresponding to the specified address, data corresponding to memory cells having addresses contiguous to the specified address. That is, "pre-fetching" data into the memory output register 105 in anticipation of contiguous accesses immediately following. Hence, by storing the additional data fetched in registers, subsequent data may be made available in the period of time required to read each register, which is a time period shorter than that required for the first or "initial" access. With pre-fetching, the total throughput time for completing a number of sequential accesses is significantly reduced when compared to the total time of individual accesses without prefetching.

FIG. 2 shows an example of a timing scheme in a system having an organization such as shown in FIG. 1. The first data output is provided after a total access time (tAA), as measured from the time address data is made available to the address input register 100, to the time when data output is made available at the memory output buffers 106. In this example, tAA has two components: (i) core access time (tASA), i.e., the period of time between when address data is ready at the address input register 100 to the time when data is ready to be latched at the input terminals of memory output register 105; and, (ii) output enable time (tRCO), i.e. the period of time between when the memory output register 105 is provided an enable signal ("clock") to gate the content of the register onto the output terminals of the register, to the time data output is ready at the output buffers 106. In the ideal case, i.e. data are latched as soon as they are made available to the memory output register 105, tAA is the sum of tASA and tRCO. In the ideal system, where maximum memory access overlap is exploited, the next data stored in next contiguous addresses are ready at the memory output buffers 106 every tRCO after the initial access, rather than every tAA, as required for the initial access. In this mode of access, called "burst" mode, only the initial address is specified, and data from contiguous addresses are provided sequentially thereafter until the burst mode is terminated, or when all the prefetched data are output.

In the prior art, such as the implementation shown in FIG. 3, the ideal speed-up is limited by the number of data prefetched, since an initial access must be made after the last datum is read from the registers in which the prefetched data are stored. FIG. 3 shows, for example, a memory system 30 similar to the memory system shown in FIG. 1 organized such that each bit is selected by the two-part address as discussed above; the row (x-) address part is stored in address counter 300, and the column (y-) address A0–A3 selects which register of the memory output registers R0–R7 is output. This memory system 30's output is 8-bit wide. In this organization, sixty four bit lines are activated simultaneously, so that the memory array 303 provides simultaneously to registers R0 through R7 sixty four bits (8 bytes) corresponding to eight 8-bit data from eight contiguous addresses. Each 8-bit datum can therefore be provided for output sequentially by selectively enabling the outputs of registers R0 and R7 in order of each datum's address. The necessary enabling signals, or clock signals, are provided by the control logic 307. The registers R0 through R7 are also provided output buffers.

However, the maximum number of bytes output in burst mode is limited to the width of the row, i.e. eight in this example. To receive the next eight bytes of data contiguously in the next row, or in the same row, the device requesting memory access must go into a wait state or "stutter", as it is known in the art, until another initial access is made to the required data. It is desirable to have a memory system in which all subsequent accesses are provided in burst mode after the initial access, regardless of whether row boundaries are crossed.

SUMMARY OF THE INVENTION

In accordance with the present invention, two output register banks are provided in a memory system in which the memory array is divided into left and right halves. A word line in the left half memory array may be activated independently but simultaneously with a word line in the right half of the memory array. When enabled, the first register bank latches simultaneously, from a first set of bit lines, data corresponding to a first set of contiguous addresses. Likewise, when enabled, the second register bank independently latches, from a second set of bit lines, data corresponding to a second set of contiguous addresses following the first set of contiguous addresses. The first and second set of contiguous addresses may involve the same or different word lines. When the content of one register bank is sequentially output according to addresses of the data therein, the other data bank is being loaded with data from the next set of the bit lines corresponding to the next set of contiguous addresses following the set of contiguous addresses of the data being output. In accordance with the present invention, it is further provided that, during the initial access, both register banks are loaded simultaneously. Control is provided so that, if a row boundary is crossed upon the initial access, the first register bank contains data from one row, and the second register bank contains data in the next row. As a result, the present invention provides a continuous burst mode output regardless of any row or address boundaries.

These features and other advantages of the present invention are better understood after considering the following detailed description in conjunction with the accompanying drawings.

DETAILED DESCRIPTION

A method in which burst mode is maintained indefinitely after initial access is described in copending application, "Architecture for High Speed Contiguous Sequential Access Memories", by Elvan S. Young et al., Ser. No. 07/558,033, also assigned to Advanced Micro Devices, Inc., filed on the same day as this application, and which is hereby incorporated by reference in its entirety.

Figure 1:
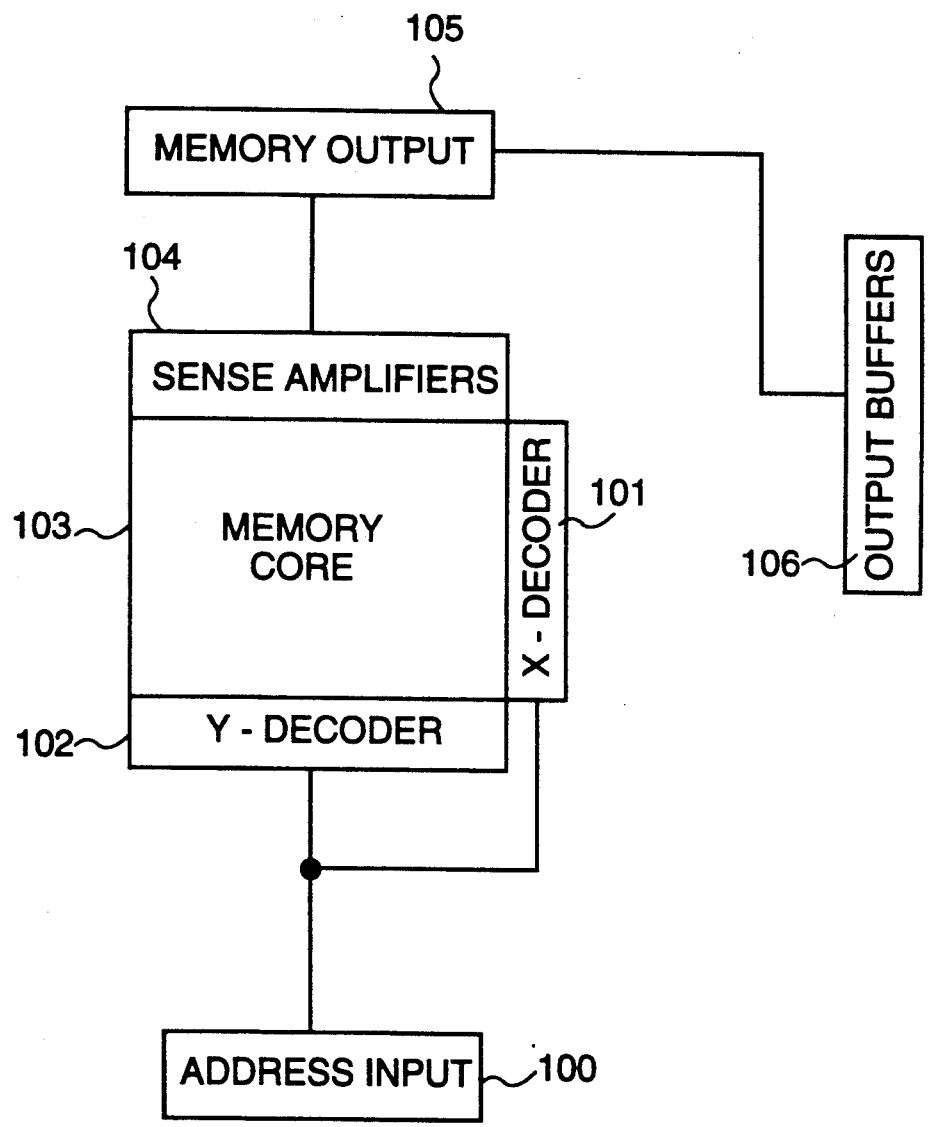
FIG. 1 shows a generalized organization of a memory system.
Figure 2:
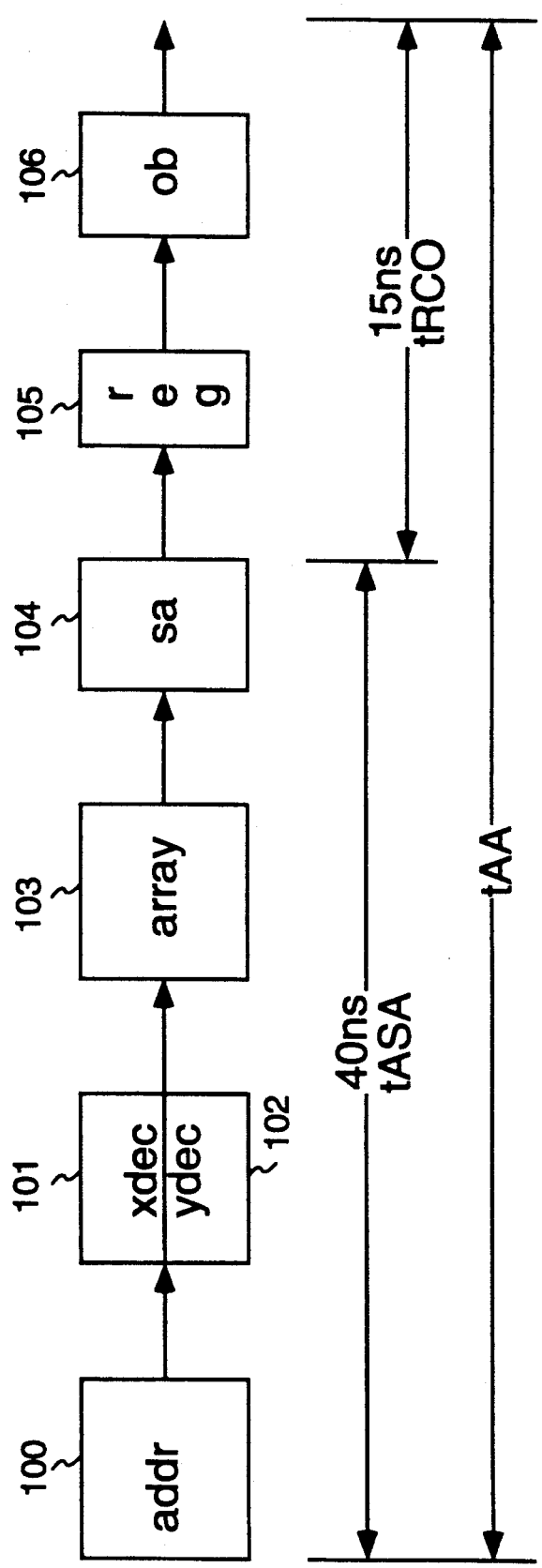
FIG. 2 shows an example of a timing scheme for a memory system having an organization such as shown in FIG. 1.
Figure 3:
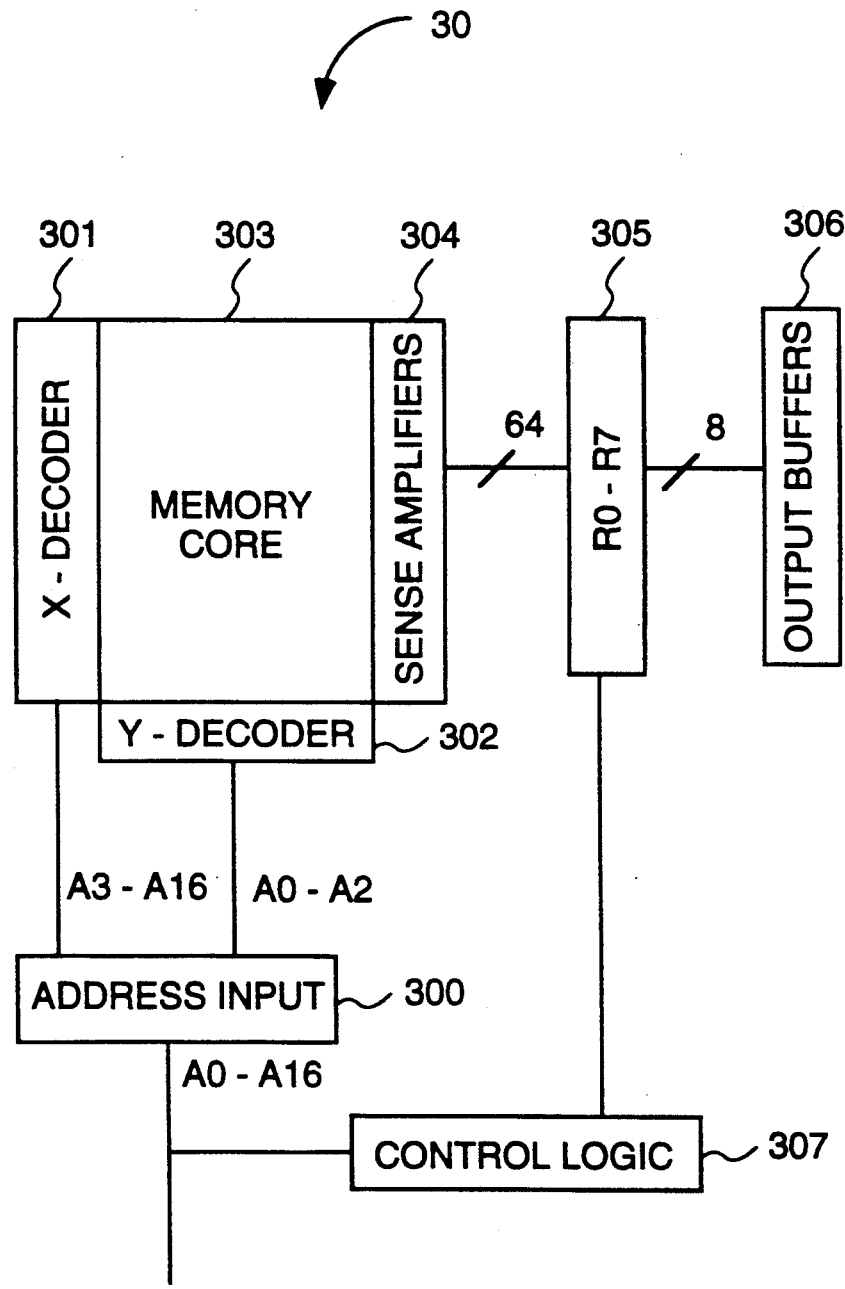
FIG. 3 shows a memory organization 30 allowing a maximum of eight bytes to be output in burst mode.
Figure 4:
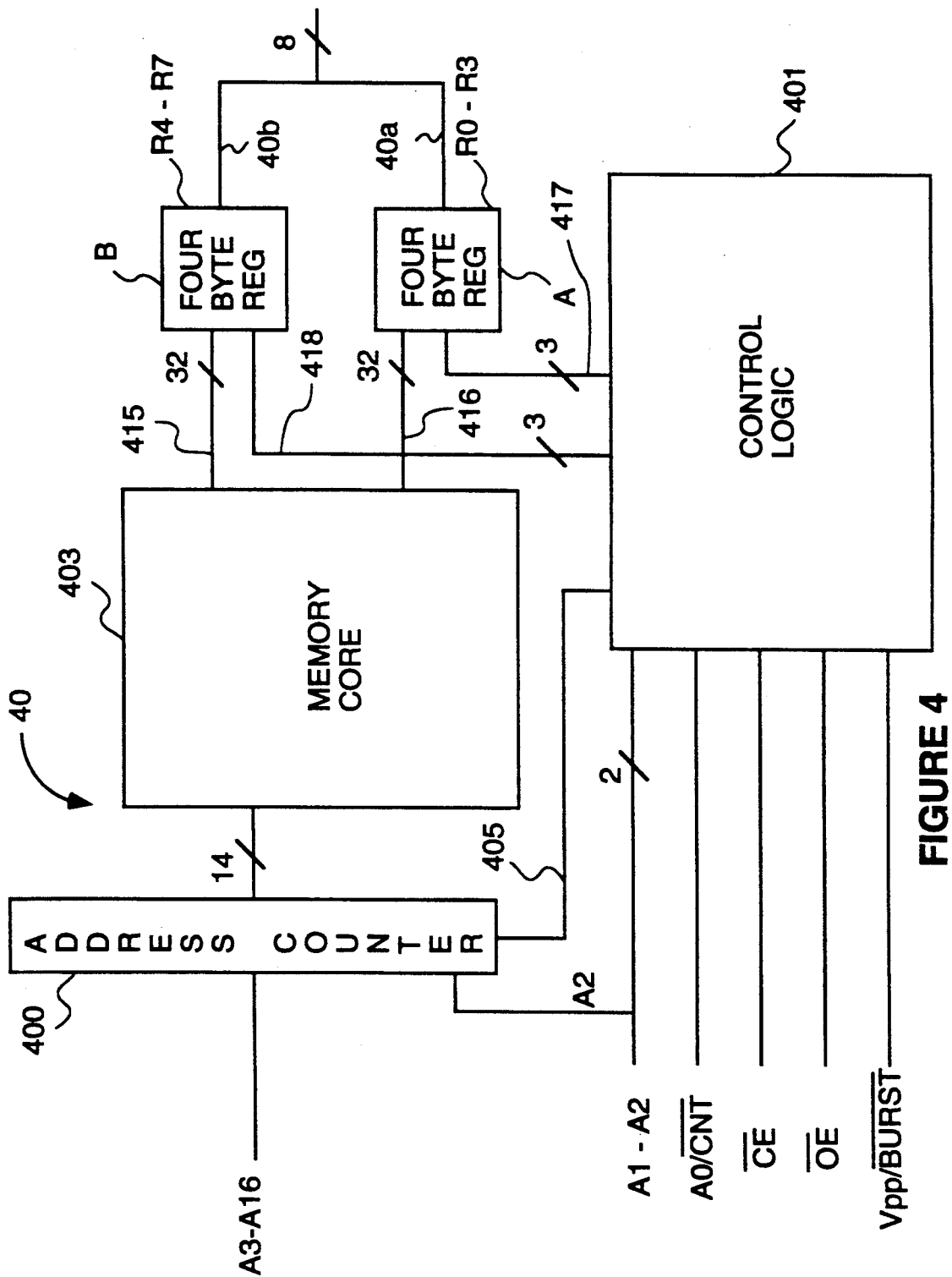
FIG. 4 shows a memory organization 40 allowing indefinite number of bytes to be output under burst mode, but requiring the initial access be made at a 4-byte boundary.

In the memory system 40 which is described in the aforementioned copending application, and reproduced in FIG. 4, the memory output registers R0–R7 are divided into two banks A and B. Under this organization, registers A and B are interleaved for loading and output of memory data. When either register bank is accessing and loading data from a number of memory cells with contiguous addresses ("loading phase") the other register bank outputs datum by datum in the order of the contiguous addresses the data loaded into it during the last loading phase ("output phase"). In this manner, the time required in the loading phase of one register bank is overlapped with output phase of the other register bank, thereby allowing, after the initial access, continuous sequential access of indefinite duration to memory system 40.

The operation of memory system 40 described in the aforementioned copending application shown in FIG. 4 is feasible if each register bank satisfies the relation $n \times tRCO > tASA$, where n is the number of registers in the register bank. However, there is also a restriction that the initial address must be specified to a fixed address boundary, e.g. the 4-byte address boundary in the embodiment described in the aforementioned copending application. This is because, if the initial access is to an address away from the specified boundary, the data in the specified memory cell will be loaded in a register in the register bank other than the first register. Therefore, the amount of time available to output in contiguous address order the data in the remaining registers of the register bank will be insufficient to overlap the loading phase of the other register bank without stutter. Using the memory system 40 as an example, it can be seen that, in order to provide continuous sequential access without stutter, the first byte in bank B must be ready tRCO after the last byte in bank A is made available, even though a row boundary is crossed. However, this requirement cannot be met in the case when the initial access is to any byte other than the first byte of bank A, since the sequential access time of the desired data in register bank A is insufficient to overlap tASA required to load register bank B. In the memory system 40, continuous access is achieved by restricting the initial access to the datum received by register R0 (i.e. the initial access must be to an address on a 4-byte boundary).

The present invention removes the restriction on the address of the first datum received in burst mode, thereby providing continuous sequential access every tRCO after the initial access, from any byte and regardless of whether row boundaries are crossed.

Figure 5:
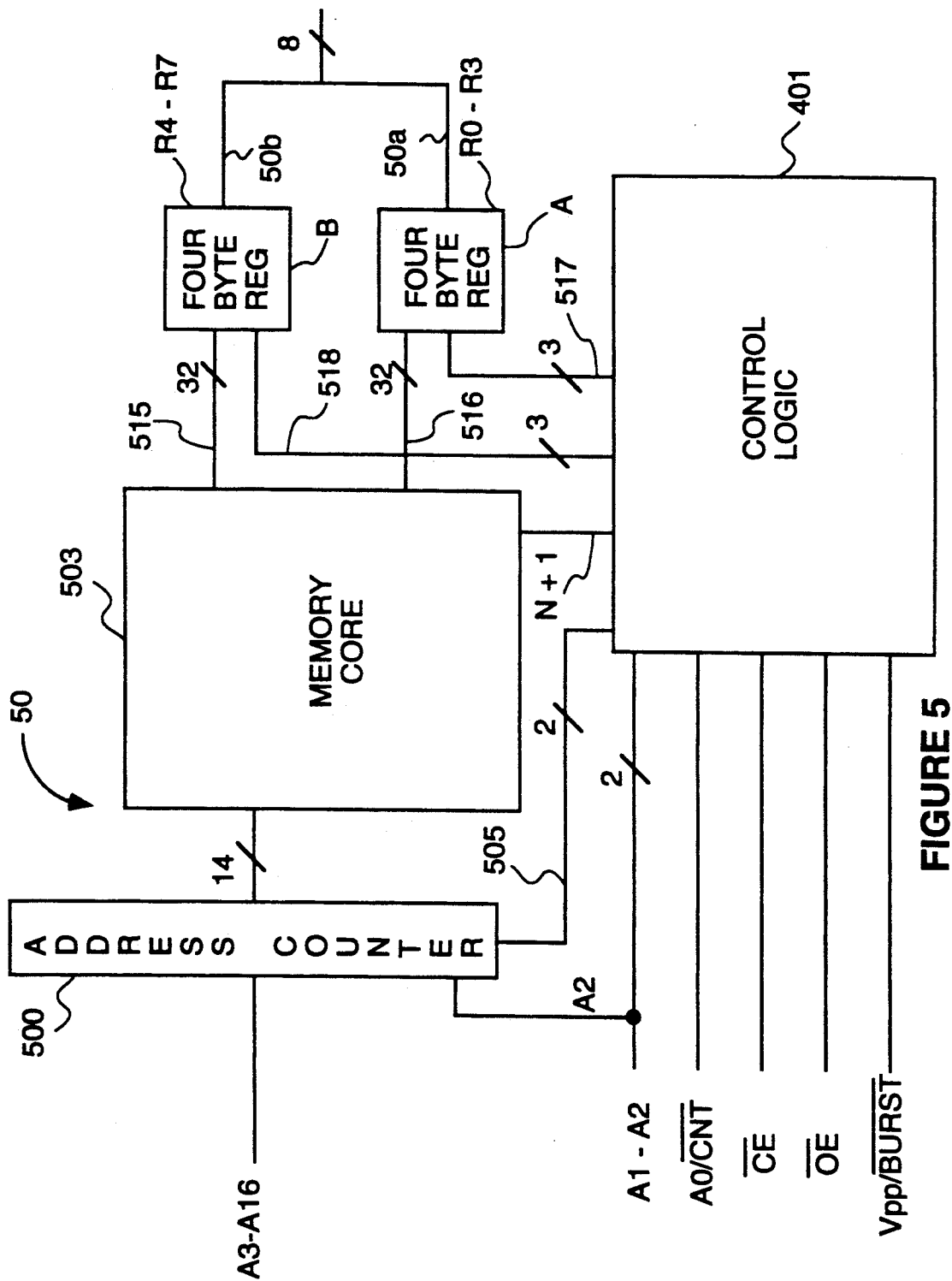
FIG. 5 shows a memory organization 50 allowing indefinite number of bytes to be output under burst mode, without restriction on the address of initial access, in accordance with the present invention.

In accordance with the present invention, a memory system 50 is provided as shown in FIG. 5. Like memory system 40 shown in FIG. 4, the output registers are divided into two banks A and B, receiving data from groups of bit lines on 32-bit busses 516 and 515 respectively with each group of bits being a byte at the address which least significant three bits are specified by the address bits A0–A2. 3-bit Control signal busses 417 and 418 specify which of the four bytes in each of register banks A and B is to be output, and accordingly asserts an output enable signal to each register bank to enable its output buffer. However, unlike the memory system 40 provided in FIG. 4, the memory system 50 is organized into left and right halves, such that the word lines in each half of the memory system 50 are controlled independently of the word lines in the other half.

Figure 6:
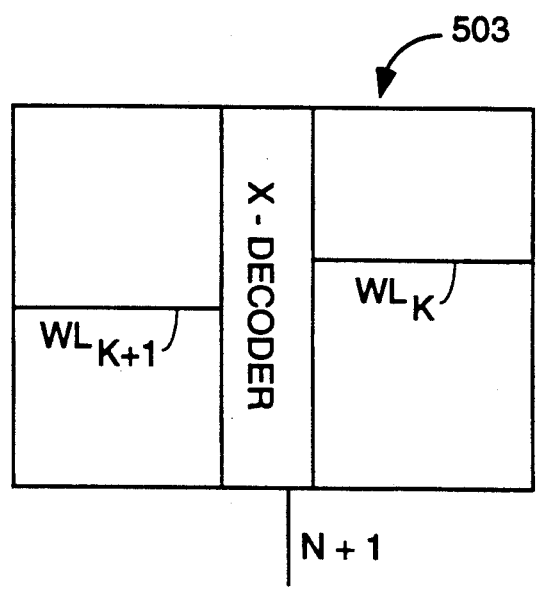
FIG. 6 shows the organization of the memory core 503 of the memory system 50 shown in FIG. 5, in accordance with the present invention.

The organization of memory array 503 is shown in FIG. 6. As shown in FIG. 6, the memory array 503 is divided into left and right halves. Word lines $WL_{K+1}$ and $WL_K$, corresponding to consecutive row addresses are activated simultaneously when signal N+1 is asserted. When signal N+1 is not asserted, activated word lines in both halves have the same row address. During the initial access of memory system 50, rather than loading four bytes into register A, as in memory system 40 shown in FIG. 4, eight bytes of data are loaded into registers A and B simultaneously from the initial access of memory system 50. As a result of the ability to activate word lines in the left and right halves independently, register banks A and B may be loaded simultaneously upon initial access with data from two different rows of memory cells, corresponding to two different word lines.

As in memory system 40, the datum corresponding to the initial address is always loaded in register bank A. If the initial access is made to a byte within four bytes of the row boundary, then the four bytes loaded in register bank A and the next four bytes loaded into register bank B are provided from memory cells of both left and right halves of the memory array in different word lines. This condition is detected by control logic 501 from the column address A0-A2 specified. Upon detection of this condition, the signal labelled N+1 is asserted, so that the word lines activated in the right and the left halves of the memory core correspond respectively to the word line containing the memory cell of the initial access, and the next higher word line. The four bytes of data from the word line specified in the initial access are gated to register bank A, and the four byte data from the memory cell of the next higher word line are gated to register bank B. In this manner, the data to be next accessed in register bank B are made available at the same time as the data in register bank A, even though a row boundary is crossed. As a result, the first byte of the data in register bank B is made available without stutter tRCO after the last byte of register bank A is output, even if the initial access is to a byte located other than at the 4-byte boundary.

Figure 7A:
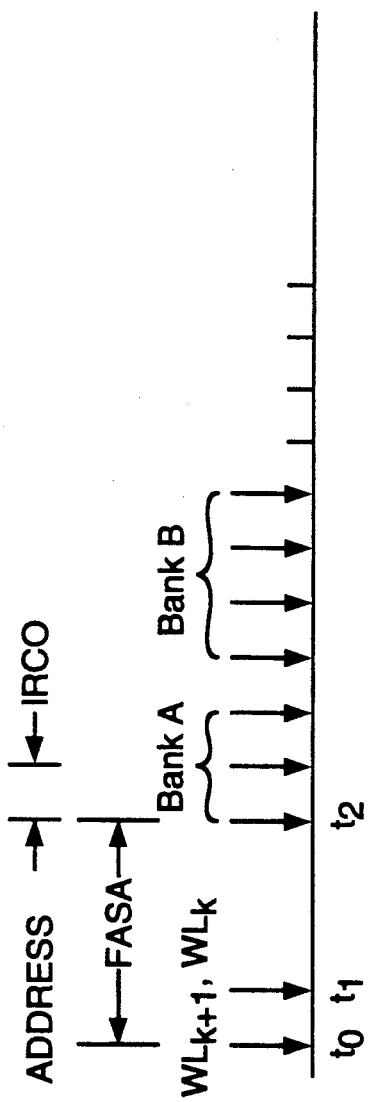
FIG. 7(a) shows an event diagram illustrating the sequence of events relating to an initial address specifying a byte within four bytes of a row address boundary.
Figure 7B:
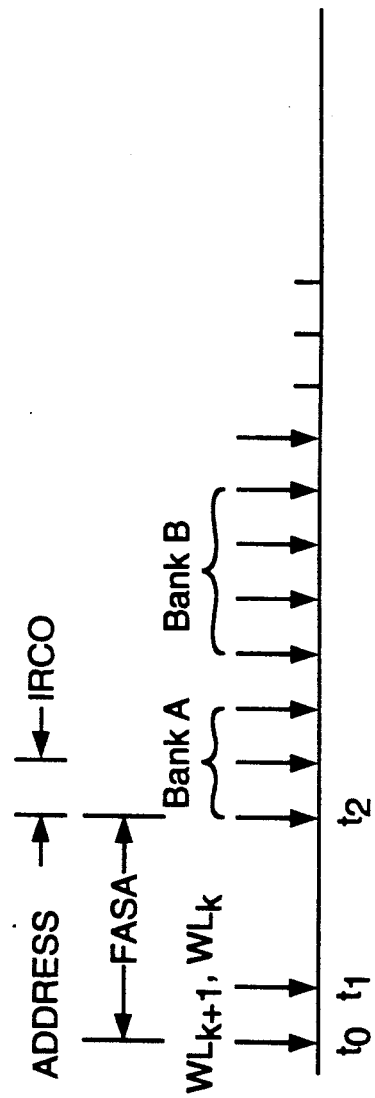
FIG. 7(b) shows an event diagram illustrating the sequence of events relating to an initial address specifying a byte not within four bytes of a row address boundary.

After the initial access, register banks A and B may be read and loaded in the same interleaving manner as described in the aforementioned copending application. The possible sequences of events between receipt of an initial address to continuous output of data without stutter are summarized generally by event diagrams FIGS. 7(a) and 7(b). Event diagram FIG. 7(a) shows receipt at time $t_0$ of a two-part address which requires a third output word to cross a row address boundary. Event diagram FIG. 7(b) shows receipt at time $t_0$ of a two-part address in which a row address boundary is not crossed within the first four bytes of data output. As shown in event diagram 7(a), since a row address boundary is crossed within four bytes of output, word lines $WL_{k+1}$ and $WL_k$ in the left and right halves of the memory are activated, respectively, at time $t_1$. As shown in event diagram 7(b), since a word line boundary is not crossed within four bytes of output, work lines $WL_k$ and $WL_k$ in the left and right halves of the memory are activated, respectively, at time $t_1$. Both event diagrams show output from register bank A and register bank B at intervals of $t_{RCO}$ after the initial access time of $t_{ASA}$. Therefore, by interleaving loading and reading register banks A and B, and by allowing the initial access to two groups of memory cells of contiguous addresses on two word lines, continuous access of indefinite duration under burst mode is achieved from any initial address regardless of row or byte boundaries.

The embodiments described herein are intended to be illustrative of the general principles of the present invention. It is expected that a skilled person in the art, in consideration of the above description and the accompanying drawings, will be able to derive numerous modifications and variations within the scope of the present invention.

We claim:

1. A memory system capable of providing output data upon receiving a two-part address comprising row and column addresses, said memory system comprising:
   a memory array having a plurality of memory cells organized into first and second portions of said memory array, each portion of said memory array having a plurality of word lines and a plurality of bit lines, wherein said row address selects one word line in each of said first and second portions of said memory array, wherein each column address selects a plurality of bit lines forming data words, and wherein word lines in said first portion of said memory array are activated independently from word lines in said second portion of said memory array;
   logic means for activating word lines and bit lines in said memory array such that a predetermined number of output data words corresponding to memory cells having contiguous addresses are provided from said memory array, wherein, when a subset of said number of output data words are stored in memory cells in said first portion of said memory array and the remaining of said number of output data words not in said subset are stored in memory cells of said second portion of said memory array, said logic means activates simultaneously in said first portion of said memory array a word line corresponding to said row address and in said second portion of said memory array a word line corresponding to said row address increased by one; and
   an internal register for receiving the data words corresponding to contents of memory cells accessed by said word lines in said first and second portions of said memory array, said internal register providing said data words as output data of said memory system one data word at a time in contiguous address order, said internal register providing each data word, after a first data word, at a time interval substantially less than the time interval between said memory system receiving said two-part address and said internal register providing said first data word, regardless of the position of said first data word in said internal register.

2. A memory system capable of providing output data upon receiving an address formed by a row address and a column address, comprising:
   first and second pluralities of memory cells, each memory cell accessible by activating a word line selectable by said row address and a plurality of bit lines selectable by said column address, such that data words formed by contents of said memory cells in said first plurality of memory cells is being accessed when said column address belongs to a first range of contiguous column addresses, and data words formed by contents of memory cells of said second plurality of memory cells is being accessed when said column address belongs to a second range of contiguous column addresses, said second range of contiguous column addresses being column addresses numerically greater than said first range of contiguous column addresses;
   logic means for, when a data work in said first plurality of memory cells is accessed, simultaneously selecting in each of said first and second pluralities of memory cells a word line corresponding to said row address and, when a data work in said second plurality of memory cells is accessed, selecting in said second plurality of memory cells a word line corresponding to said row address, and simultaneously selecting in said first plurality of memory cells a word line corresponding to said row address increased by one;
   an internal register for receiving the data words corresponding to contents of memory cells accessed by said word lines in said first and second plurality of memory cells, said internal register providing said data words as output data of said memory system one data word at a time in contiguous address order, said internal register providing each data word, after a first data word, at a time interval substantially less than the time interval between said memory system receiving said row and column addresses and said internal register providing said first data word, regardless of the position of said first data word in said internal register.

3. A memory system as in claim 2, wherein said selected memory cells are accessed by bit lines corresponding to contiguous column addresses including said column address.

* * * * *

UNITED STATES PATENT AND TRADEMARK OFFICE
CERTIFICATE OF CORRECTION

PATENT NO.    :  5,285,421
DATED         :  February 8, 1994
INVENTOR(S)   :  Elvan S. Young It is certified that error appears in the above-identified patent and that said Letters Patent is hereby corrected as shown below:

Column 1, line 18:  "Y" should read --y--.

Signed and Sealed this

Sixth Day of December, 1994

Attest:

BRUCE LEHMAN

*Attesting Officer*  *Commissioner of Patents and Trademarks*